United States Patent
Loo et al.

[11] Patent Number: 6,046,659
[45] Date of Patent: Apr. 4, 2000

[54] DESIGN AND FABRICATION OF BROADBAND SURFACE-MICROMACHINED MICRO-ELECTRO-MECHANICAL SWITCHES FOR MICROWAVE AND MILLIMETER-WAVE APPLICATIONS

[75] Inventors: Robert Y. Loo, Agoura Hills; Adele Schmitz, Newbury; Julia Brown, Santa Monica; Jonathan Lynch, Oxnard; Debabani Choudhury, Woodland Hills; James Foschaar, Thousand Oaks, all of Calif.; Daniel J. Hyman, Cleveland Hts., Ohio; Brett Warneke, Berkeley, Calif.; Juan Lam, Agoura Hills, Calif.; Tsung-Yuan Hsu, Westlake Village, Calif.; Jae Lee, University Heights; Mehran Mehregany, Pepper Pike, both of Ohio

[73] Assignees: Hughes Electronics Corporation, El Segundo, Calif.; Rosemont Aerospace, Inc., Burnsville, Minn.

[21] Appl. No.: 09/080,326

[22] Filed: May 15, 1998

[51] Int. Cl.[7] .............................. H01P 1/10; H01H 57/00
[52] U.S. Cl. .......................... 333/262; 200/181; 200/600
[58] Field of Search ............................ 333/262; 200/181, 200/600

[56] References Cited

U.S. PATENT DOCUMENTS

| | | | |
|---|---|---|---|
| 5,578,976 | 11/1996 | Yao | 333/262 |
| 5,629,565 | 5/1997 | Schlaak et al. | 200/181 X |
| 5,638,946 | 6/1997 | Zavracky | 200/181 |

FOREIGN PATENT DOCUMENTS

| | | | |
|---|---|---|---|
| 63-54801 | 3/1988 | Japan | 333/262 |

*Primary Examiner*—Justin P. Bettendorf
*Attorney, Agent, or Firm*—V. D. Duraiswamy; M. W. Sales

[57] ABSTRACT

Methods for the design and fabrication of micro-electro-mechanical switches are disclosed. Two different switch designs with three different switch fabrication techniques are presented for a total of six switch structures. Each switch has a multiple-layer armature with a suspended biasing electrode and a conducting transmission line affixed to the structural layer of the armature. A conducting dimple is connected to the conducting line to provide a reliable region of contact for the switch. The switch is fabricated using silicon nitride as the armature structural layer and silicon dioxide as the sacrificial layer supporting the armature during fabrication. Hydrofluoric acid is used to remove the silicon dioxide layer with post-processing in a critical point dryer to increase yield.

20 Claims, 5 Drawing Sheets

DESIGN AND FABRICATION OF BROADBAND SURFACE-MICROMACHINED MICRO-ELECTRO-MECHANICAL SWITCHES FOR MICROWAVE AND MILLIMETER-WAVE APPLICATIONS

This invention was made with Government support under Contract No. N66001-96-C-8636 awarded by the Department of the Navy. The Government has certain rights in this invention.

BACKGROUND OF THE INVENTION (a) Technical Field of the Invention

The present invention relates generally to switches. More particularly, it relates to the design and fabrication of microfabricated electromechanical switches.

(b) Description of Related Art

In communications applications, switches are often designed with semiconductor elements such as transistors or pin diodes. At microwave frequencies, however, these devices suffer from several shortcomings. Pin diodes and transistors typically have an insertion loss greater than 1 dB, which is the loss across the switch when the switch is closed. Transistors operating at microwave frequencies tend to have an isolation value of under 20 dB. This allows a signal to 'bleed' across the switch even when the switch is open. Pin diodes and transistors have a limited frequency response and typically only respond to frequencies under 20 GHz. In addition, the insertion losses and isolation values for these switches varies depending on the frequency of the signal passing through the switches. These characteristics make semiconductor transistors and pin diodes a poor choice for switches in microwave applications.

U.S. Pat. No. 5,121,089 issued Jun. 9, 1992 to Larson, and assigned to the assignee of the present invention, discloses a new class of microwave switch—the micro-electro-mechanical (MEM) switch. The MEM switch has a very low insertion loss (less than 0.2 dB at 45 GHz) and a high isolation when open (greater than 30 dB). In addition, the switch has a large frequency response and a large bandwidth compared to semiconductor transistors and pin diodes. These characteristics give the MEM switch the potential to replace traditional narrow-bandwidth PIN diodes and transistor switches in microwave circuits.

The Larson MEM switch utilizes an armature design. One end of a metal armature is affixed to an output line, and the other end of the armature rests above an input line. The armature is electrically isolated from the input line when the switch is in an open position. When a voltage is applied to an electrode below the armature, the armature is pulled downward and contacts the input line. This creates a conducting path between the input line and the output line through the metal armature.

Rockwell International has also developed a MEM switch based on an armature design. The Rockwell switch uses a combination of insulating structural layers and metals as the armature, which increases the mechanical durability of the MEM switch, but the control of the mechanical characteristics, such as internal stress and elastic modulus of the insulating layer, is limited by stoichiometric control of the silicon dioxide films. The Rockwell switch uses multiple contact points with flat metal contacts that are likely to have time-varying contact characteristics. In addition, the Rockwell switch is fabricated using an organic polyimide as a sacrificial armature support layer. This leaves organic residue on the switch surfaces after fabrication, which are difficult to remove and adversely affect switch performance and reliability.

Texas Instruments has developed a MEM switch based on a diaphragm configuration. The switch comprises of a flexible membrane supported between two posts. When a voltage is applied between the membrane and an electrode beneath the membrane, the membrane is drawn closer to the electrode by an electrostatic force. The closer together the membrane and electrode, the higher the capacitance between the two. High frequency signals are able to transmit through high capacitances and as such these switches do not need to make actual metallic contact in their "closed" position. High applied voltages are needed, however, to deform the membrane, and isolation characteristics at low frequency are very poor because of the inherent coupling capacitances of the switch structure. In addition, the Texas Instruments switch is highly dependent on membrane stress and on the fabrication process itself, such that the switch is susceptible to material creep and fatigue. Accordingly, there is a need for a MEM switch with a resilient structure and reliable mechanical and electrical contact characteristics.

SUMMARY OF THE INVENTION

The present invention relates to a method of design and fabrication of a micro-electro-mechanical switch. Two different fundamental switch structures are discussed and three different fabrication sequences are presented, for a total of six switch designs covered in this work. Every switch design has a number of important features in common. Each switch is designed with a bi-layer or tri-layer armature to give the switch superior mechanical qualities. In addition, the switches have conducting dimples with defined contact areas to improve contact characteristics. The switch is fabricated using improved materials and processes that prevent the armature from sticking to the substrate during fabrication and also ensure superior mechanical qualities and uniform contact properties of the switch.

One embodiment of the invention is a micro-electro-mechanical switch comprising an input line, an output line, and an armature. The input line and the output line are located on top of a substrate. The armature is made of at least one structural layer, a conducting transmission line on top of, below, or between the structural layers, and a suspended armature bias electrode similarly placed. One end of the structural layer is connected to the substrate, and a substrate bias electrode is located on top of the substrate below the suspended armature bias electrode on the armature.

A first end of the conducting transmission line is connected to the output line, and a second end rests above the input line when the switch is in an open position and contacts the input line when the switch is in a closed position. The conducting transmission line also contains a conducting dimple such that the distance between the conducting dimple and the input line is less than the distance between the conducting transmission line and the input line so that the conducting dimple contacts the input line when the switch is in the closed position. The structural layer may be formed below, above, or both above and below the conducting line. The input line, output line, armature bias pad, substrate bias pad, and substrate bias electrode are comprised of a stack of films referred to as the first metal layer which is comprised of a film of gold on top of a 1000 angstrom film of platinum on top of a 250 angstrom film of titanium. The armature bias electrode, suspended transmission line, and contact dimples are made of a film stack referred to as the second metal layer, which is identical to the first metal layer without the platinum film.

The present invention may also be embodied in a process for making a micro-electro-mechanical switch. The process comprises a first step of depositing a first metal layer onto a substrate to form an input line, an output line, substrate bias electrodes, substrate bias pads, and armature bias pads. A support layer, also known as a sacrificial layer, is deposited on top of the first metal layer and the substrate, and a beam structural layer is deposited on top of the sacrificial layer. The beam structural layer forms an armature with one end of the beam structural layer affixed to the substrate near the output line. The process further comprises the steps of removing a portion of the structural layer and a portion of the support layer to create a dimple mold. A conducting dimple is formed in the dimple mold when the conducting transmission line and suspended armature bias electrodes are fabricated by depositing a second metal layer, such that the suspended armature bias electrode is electrically connected to the armature bias pad. A second structural layer may or may not be deposited on top of the second metal layer for stress matching and thermal stability of the switch. Finally, the sacrificial layer is removed from beneath the armature to release the armature and allow the switch to open and close.

The materials and fabrication techniques used for the process comprise of standard integrated circuit manufacturing materials and techniques. The sacrificial layer is made of silicon dioxide and is removed by wet etching the silicon dioxide with buffered HF and with post processing in a critical point dryer. The beam structural layer is comprised of silicon nitride. The first metal layer is comprised of a film of gold on top of a 1000 angstrom film of platinum on top of a 250 angstrom film of titanium. The second metal layer is comprised of a film of gold on top of a 250 angstrom film of titanium. A second beam structural layer may be deposited on top of the conducting line such that the conducting line is encased between the first structural layer and the second structural layer.

In alternative embodiments of the present invention, the second metal layer is deposited underneath, in between, and on top of the structural layers. If the second metal layer is underneath the structural layers, then a dielectric or insulator is deposited on top of the substrate bias electrode to prevent electrical shorting to the armature bias electrode when the switch is in the closed position

BRIEF DESCRIPTION OF THE DRAWINGS

These and other features and advantages will become more apparent from a detailed consideration of the invention when taken in conjunction with the drawings in which.

DESCRIPTION OF THE PREFERRED EMBODIMENT

Figure 1A:
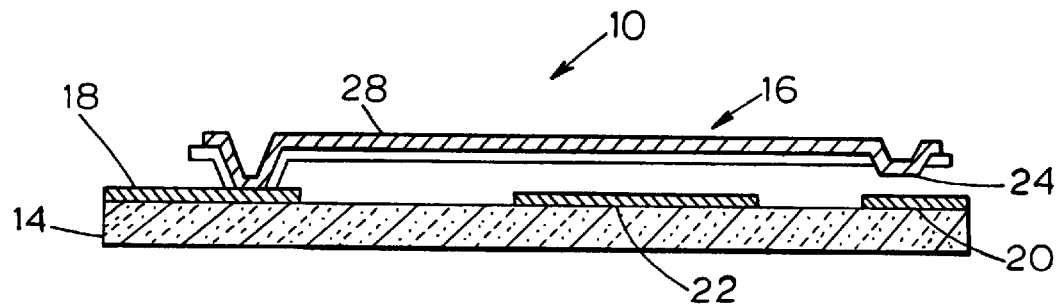
FIG. 1A is a side elevational view of one embodiment of a MEM switch embodying the present invention in the open position.

FIG. 1A is a general overview of a micro-electromechanical (MEM) switch 10 in an "open" position. One end of an armature 16 is affixed to the substrate 14 near an output line 18 on the substrate 14. The other end of the armature 16 is positioned over an input line 20. A substrate bias electrode 22 is printed on the substrate 14 below the armature 16. The armature 16 is electrically isolated from the substrate bias electrode 22 by an air gap. A conducting dimple 24 protrudes from the armature 16 toward the input line 20. A conducting line 28 (shown in FIG. 2) is printed on the armature 16 and electrically connects the dimple 24 to the output line 18. When the MEM switch 10 is in an open position, the dimple 24 is electrically isolated from the input line 20 by an air gap.

Figure 1B:
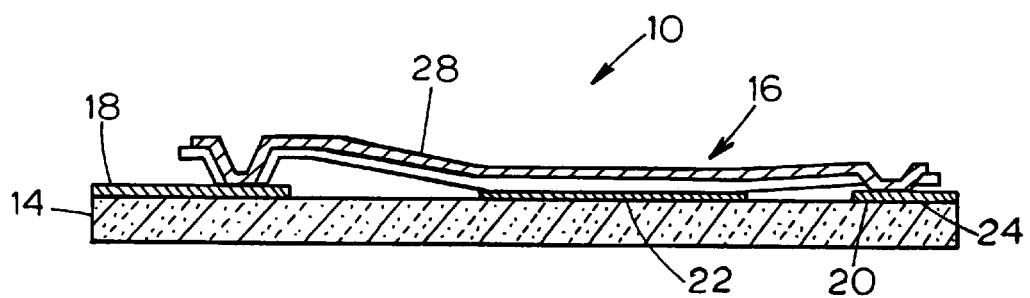
FIG. 1B is the MEM switch of FIG. 1A in a closed position.

FIG. 1B depicts the MEMS switch 10 in FIG. 1A in a "closed" state. When a voltage is applied between the suspended armature bias electrode 30 and the substrate bias electrode 22, an electrostatic attractive force will pull the suspended armature bias electrode 30 as well as the attached armature 16 towards the substrate bias electrode 22, and the contact dimple 24 touches the input line 20. Since the output line 18 was fabricated with electrical connection to the conducting transmission line 28, the transmission line 28 and the dimple 24 bridge the gap between the input line 20 and the output line 18, thereby closing the MEM switch 10.

The substrate 14 may be comprised of a variety of materials. If the MEM switch 10 is intended for use with semiconductor devices, it is preferable to use a semiconducting substance such as gallium arsenide (GaAs) for the substrate 14. This allows the circuit elements as well as the MEM switch 10 to be fabricated simultaneously on the same substrate using standard integrated circuit fabrication technology such as metal sputtering and masking. For low-noise HEMT MMIC (high electron mobility transistor monolothic microwave integrated circuit) applications, indium phosphide (InP) can be used as the substrate 14. Other possible substrate materials include silicon, various ceramics, or quartz. The flexibility in the fabrication of the MEM switch 10 allows the switch 10 to be used in a variety of circuits. This reduces the cost and complexity of circuits designed using the present MEM switch.

Figure 2:
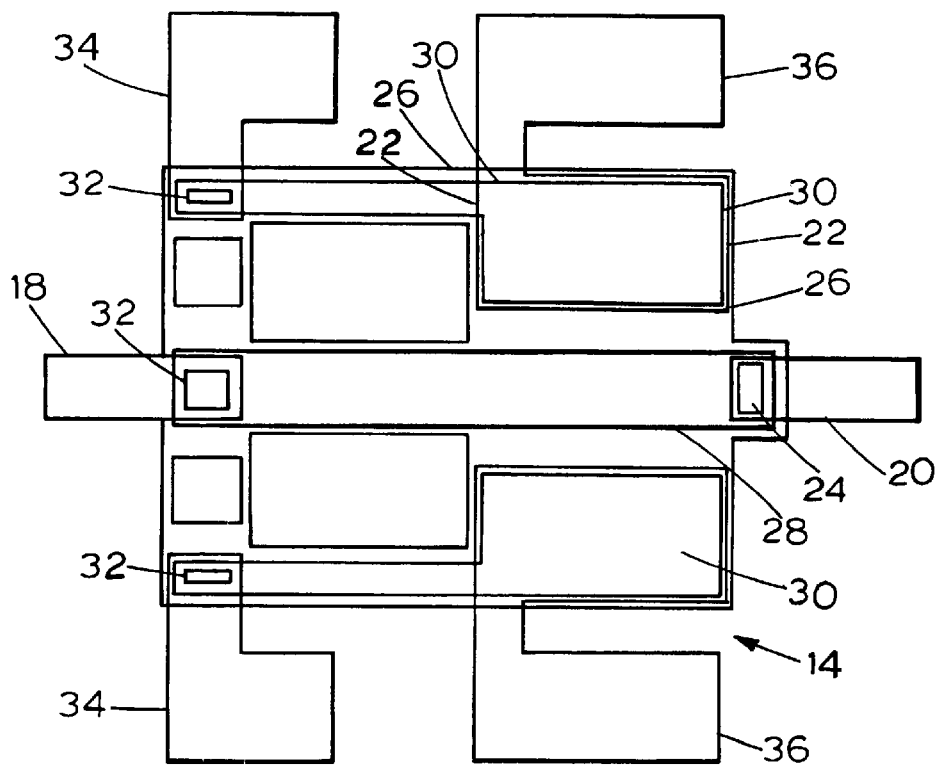
FIG. 2 is a top overview of the MEM switch of FIG. 1.

FIG. 2 depicts the MEM switch 10 of FIGS. 1A and 1B in more detail from an overview perspective. FIG. 2 shows more of the details of the armature 16, which is comprised of a beam structural layer 26, the conducting line 28, suspended armature bias electrode 30, and via hole 32. In FIG. 2 the conducting line 28 is located on top of the beam structural layer 26 and is electrically connected at one end to the output line 18. The dimple 24 (shown in FIGS. 1A and 1B) is electrically connected to the other end of the conducting line 28 and protrudes through the beam structural layer 26 at the via holes 32. When the switch 10 is in the 'open' position, the dimple 24 is separated by an air gap from the input line 20. When the armature 16 is drawn toward the substrate 14, the dimple 24 will contact the input line 20 and create an electrical connection between the input line 20 and the output line 18 through the conducting transmission line 28.

In the embodiment shown in FIG. 2, there are two suspended armature bias electrodes 30, one on each side of the conducting line 28. The suspended armature bias electrode 30 is a conducting metal pad that is electrically connected to an armature bias pad 34. The armature bias pad 34 is a connection pad that allows an external voltage source to be connected to the suspended armature bias electrode 30 through the armature bias pad 34. A substrate bias pad 36 is electrically connected to the substrate bias electrode 22 and allows an external voltage source to be connected to the substrate bias electrode 22. Typically, a positive or negative voltage is place on either the armature bias pad 34 or substrate bias pad 36 and a ground signal is placed on the other. This creates the voltage difference between the suspended armature bias electrode 30 and the substrate bias electrode 22 that causes the electrostatic attraction.

In devices that do not contain the suspended armature bias electrode 30, such as those of Larson, et. al., it is known that inherently high actuating voltages between the conducting line 28 and a substrate bias substrate bias electrode 22 are necessary to generate sufficient electrostatic forces between the armature and the substrate to close the switch because of the limited capacitive actuation area of these designs. Suspended armature bias electrode 30 is an improvement over these devices as the suspended armature bias electrode 30 increases the surface area of the conductors that will be attracted to the substrate bias electrode 22, which in turn reduces the actuation voltage required to pull the armature 16 toward the substrate 14. In addition, the use of the suspended armature bias electrode 30 rather than the conducting line 28 to pull the armature 16 toward the substrate bias electrode 22 eliminates the need for additional external components for DC biasing, such as a "bias tee", which greatly simplifies device integration.

The gap between the dimple 24 and the input line 20 is smaller than the gap between the input line 20 and the conducting line 28. When actuated by electrostatic attraction, the armature 16 bends towards the substrate 14. First the dimple 24 contacts the input line 20, at which point the armature 16 bends to allow the suspended armature bias electrode 30 to contact the substrate bias electrode 22. This fully closed state is shown in FIG. 1B. The force of the metallic contact between the dimple 24 and the input line 20 is thus dependent on the flexibility of the armature 16 and the geometry of the dimple and not on the attractive forces of the armature electrode to the substrate electrode. Metallic switches that do not have contact dimples, like those developed by Larson and at Rockwell, have contacts that depend on armature flexibility and bias strength, factors which vary with the temperature, age, and the amount of use of the MEM switch. In addition to improving repeatability, the quality of the contact itself is improved by the addition of the dimple because the dimple has a controllable size and surface texture, characteristics that are dependent on the fabrication rather than on the environment. Thus, MEM switches without the dimple 24 are more likely to have time-varying contact characteristics, a feature that may make them difficult or impossible to use in some circuit implementations.

The beam structural layer 26 is the primary support of the armature 16. The conducting line 28 is typically printed either on top of or on the underside of the beam structural layer 26. The beam structural layer 26 is made from a stress-free material such as silicon nitride. The bi-layer design of the conducting line 28 affixed to a resilient structural layer 26 gives the armature 16 superior mechanical properties to those that can be achieved with the use of the conducting line 28 alone.

A layer of SiO2 is used to support the armature 16 during the fabrication of the MEM Switch, but is removed in the last fabrication step, hence its term "sacrificial layer." It is necessary to remove this sacrificial SiO2 layer in order to free the armature 16 such that it is free to deflect out of plane of the substrate 14. An HF etchant solution is typically used, and openings in the beam structural layer 26 allow the HF to etch the sacrificial layer beneath the armature 16 in this last fabrication step as discussed below in conjunction with FIGS. 5E and 5F.

Figure 3:
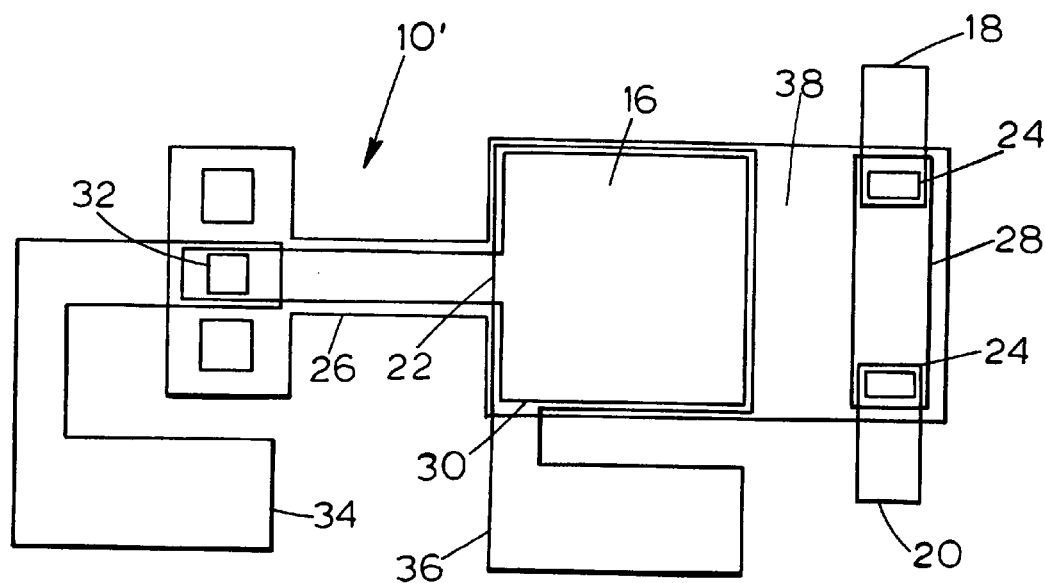
FIG. 3 is a top overview of an alternative embodiment of a MEM switch embodying the present invention, wherein the conducting transmission line is positioned over both the input line and the output line.

FIG. 3 depicts an alternative configuration of a MEM switch 10'. In this embodiment, the conducting transmission line 28 is located on the underside of the beam structural layer 26 and is not connected directly to either the input line 20 or the output line 18. Instead, the armature bias electrode 30 covers the majority of the underside of the armature 16 and the beam structural layer 26. One end of the armature 16 is affixed directly to the substrate 14. The free end of the armature 16 rests over both the input line 20 and the output line 18. The conducting transmission line 28 is located on the free end of the armature 16, also above both the input line 20 and the output line 18. When a voltage is applied between the substrate bias electrode 22 and the armature bias electrode 30, the armature 16 will bend towards the substrate 14. This forces the conducting line 28 into electrical contact with both the input line 20 and the output line 18. Signals can then pass from the input line 20 to the output line 18 through the conducting transmission line 28.

Figure 4A:
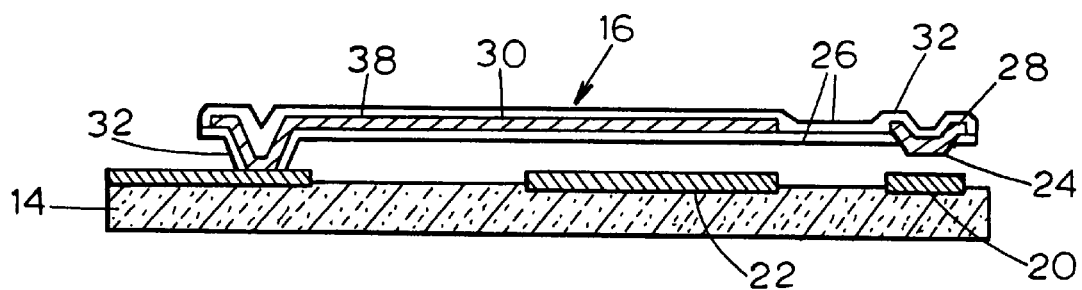
FIG. 4A shows a side elevational view of the MEM switch depicted in FIG. 3.
Figure 4B:
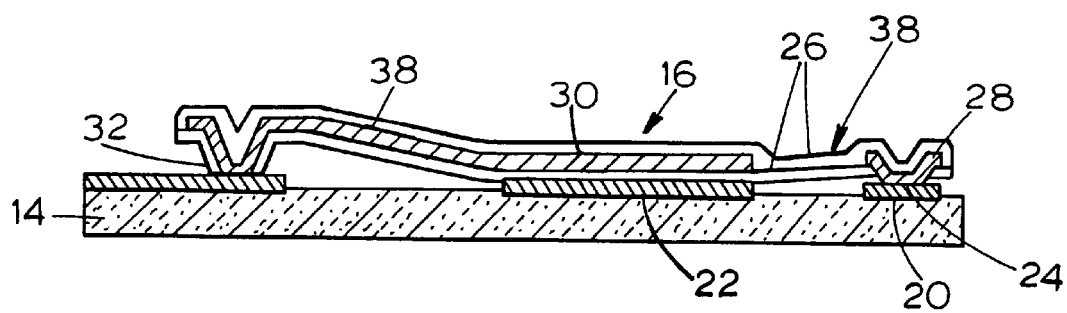
FIG. 4B is the MEMS switch of FIG. 4A in a closed position.

FIGS. 4A and 4B are side-elevational views of the MEMS switch 10' in FIG. 3. The beam structural material 26 is connected to the substrate 14 through the fixed anchor vias 32. The suspended armature bias electrode 30 is nested within the structural material 26 and electrically accessed through bias line 38 at the armature bias pad 34. The conducting transmission line 28 is at the free end of the beam structural layer 26 and is electrically isolated from the suspended armature bias electrode 30 by the dielectric structural layer 26. The contact dimples 24 of the transmission line 28 extend through and below the structural layer 26 and define the areas of metal contact to the input and output lines 20 and 18, respectively. The substrate bias electrode 22 is below the suspended armature bias electrode 30 on the surface of the substrate 14. When a voltage is applied between the suspended armature bias electrode 30 and the substrate bias electrode 22, an electrostatic attractive force will pull the suspended armature bias electrode 30 as well as the attached armature 16 towards the substrate bias electrode 22. The contact dimples 24 touch the input line 20 and the output line 18, so the conducting transmission line 28 bridges the gap between the input line 20 and the output line 18 thereby closing the MEM switch 10'.

Figure 7A:
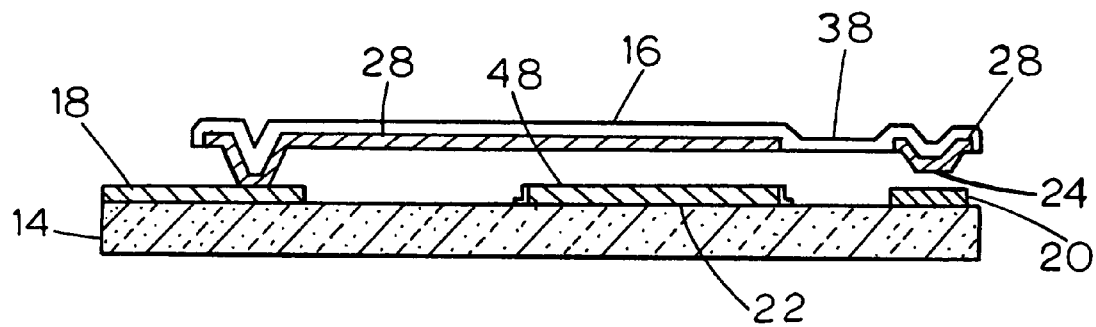
FIGS. 7A and 7B are side elevational views of an alternative embodiment of the MEM switch depicted in FIG. 3 wherein the ordering of the layers comprising the armature are altered.
Figure 7B:
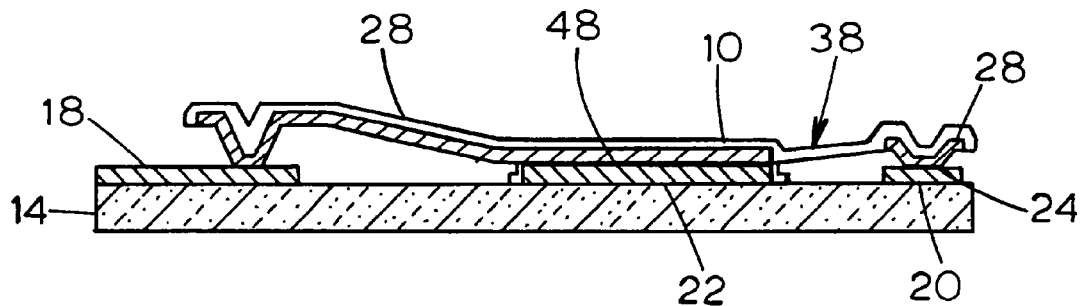

FIGS. 7A and 7B are side-elevational views of an alternative embodiment of the MEMS switch 10' in FIG. 3. An additional insulating layer 48 on top of the substrate bias electrode 22 is needed to keep the armature bias electrode 30 and the substrate bias electrode 22 from becoming electrically shorted when the switch is in the closed position.

FIGS. 5A–5F illustrate the manufacturing processes embodying the present invention used to fabricate the MEM switch 10' of FIGS. 3 and 4. The process begins with a substrate 14. In a preferred embodiment, GaAs is used as the substrate. Other materials may be used, however, such as InP, ceramics, quartz or silicon. The substrate is chosen primarily based on the technology of the circuitry the MEM switch is to be connected to so that the MEM switch and the circuit may be fabricated simultaneously. For example, InP can be used for low noise HEMT MMICS (high electron mobility transistor monolothic microwave integrated circuits) and GaAs is typically used for PHEMT (pseudomorphic HEMT) power MMICS.

Figure 5A:
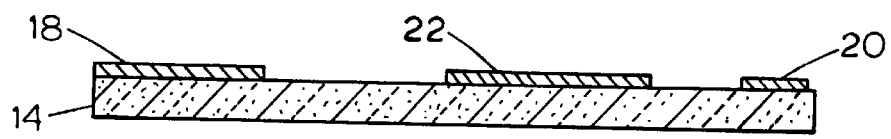
FIGS. 5A–5F are side elevational views of the MEM switch of FIG. 1 during progressive steps of a fabrication process further embodying the present invention.

FIG. 5A shows a profile of the MEM switch 10 after the first step of depositing a metal 1 layer onto the substrate 14 for the input line 20, the output line 18, and the substrate bias electrode 22 is complete. The metal 1 layer may be deposited lithographically using standard integrated circuit fabrication technology, such as resist lift-off or resist definition and metal etch. In the preferred embodiment, gold (Au) is used as the primary composition of the metal 1 layer. Au is preferred in RF applications because of its low resistivity. In order to ensure the adhesion of the Au to the substrate, a thin layer (250–500 angstroms) of titanium (Ti) is deposited, followed by a 1000 angstrom layer of platinum (Pt), and finally the Au. The Pt acts as a diffusion barrier to keep the Au from intermixing with the Ti and causing the metal to lose adhesion strength to the substrate. In the case of a III–IV semiconductor substrate, a thin layer of gold germanium (AuGe) eutectic metal may be deposited first to ensure adhesion of the Au by alloying the AuGe into the semiconductor similar to a standard ohmic metal process for any III–V MESFET or HEMT.

Figure 5B:
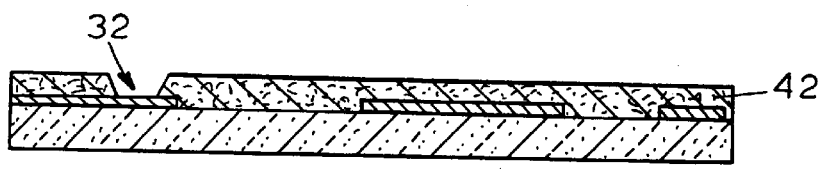

Next, as shown in FIG. 5B, a support layer 42 is placed on 20 top of the Au and etched so that the armature 16 may be produced above the support layer 42. The support layer 42 is typically comprised of 2 microns of SiO2 which may be sputter deposited or deposited using PECVD (plasma enhanced chemical vapor deposition). A via 44 is etched in the sacrificial layer 42 so that the metal of the output line 18 is exposed. The via 44 definition may be performed using standard resist lithography and etching of the support layer 42. Other materials besides SiO2 may be used as a sacrificial layer 42. The important characteristics of the sacrificial layer 42 are a high etch rate, good thickness uniformity, and conformal coating by the oxide of the metal already on the substrate 14. The thickness of the oxide partially determines the thickness of the switch opening, which is critical in determining the voltage necessary to close the switch as well as the electrical isolation of the switch when the switch is open. The sacrificial layer 42 will be removed in the final step to release the armature 16, as shown in FIG. 5F.

Another advantage of using SiO2 as the support layer 42 is that SiO2 can withstand high temperatures. Other types of support layers, such as organic polyimides, harden considerably if exposed to high temperatures. This makes the polyimide sacrificial layer difficult to later remove. The support layer 42 is exposed to high temperatures when the silicon nitride for the beam structural layer is deposited, as a high temperature deposition is desired when depositing the silicon nitride to give the silicon nitride a lower BOE etch rate. A low BOE etch rate minimizes the amount of the beam structural layer 26 that is lost when the SiO2 is etched away.

Figure 5C:
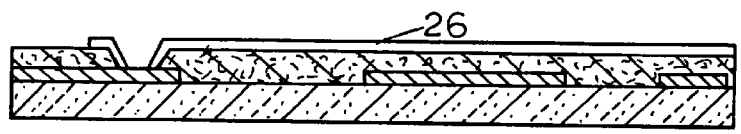

FIG. 5C shows the fabrication of the beam structural layer 26. The beam structural layer 26 is the supporting mechanism of the armature 16 and is preferable made out of silicon nitride, although other materials besides silicon nitride may be used. Silicon nitride is preferred because it can be deposited so that there is neutral stress in the beam structural layer 26. Neutral stress fabrication reduces the bowing that may occur when the switch is actuated. The material used for the structural layer 26 must have a low etch rate compared to the support layer 42 so that the structural layer 26 is not etched away when the sacrificial layer 42 is removed to release the armature 16. The structural layer 26 is patterned and etched using standard lithographic and etching processes.

The beam structural layer 26 may be formed either below or above the conducting line 28. If the beam structural layer 26 is fabricated on only one side of the conducting line 28, bowing will occur in the armature 16 when the switch is actuated if the stress in the structural layer 26 differs from the stress in the conducting line 28. The armature 16 will bow either upwards or downwards, depending upon which material has the higher stress. Bowing can change the voltage required to activate the switch and, if the bowing is severe enough, can prevent the switch from either opening (bowed downward) or closing (bowed upward) regardless of the actuating voltage. We have circumvented this problem by matching the stress levels of the second metal layer with that of the structural layers.

The beam structural layer 26 may also be formed both above and below the conducting line 28 to minimize the bowing in the armature 16. By fabricating the beam structural layer 26 on both sides of the conducting line 28, the effect of different material stress is minimized because the portion of the beam structural layer 26 that is above the conducting line 28 will flex in the same manner as the portion of the beam structural layer 26 that is below the conducting line 28. The conducting layer 28 is constrained by the structural layer 26 and will therefore flex with the structural layer 26 so that the bowing in the switch is minimized.

Figure 5D:
Figure 5E:
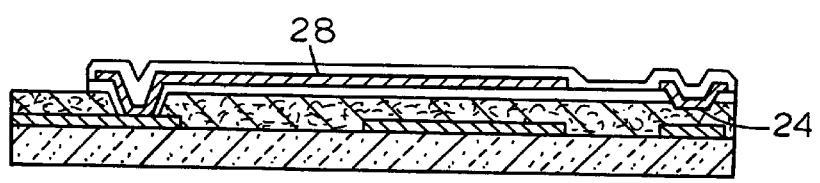
Figure 5F:
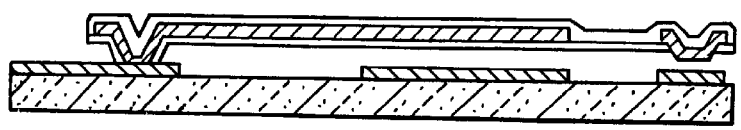

In FIG. 5D, a dimple receptacle 46 is etched into the beam structural layer 26 and the support layer 42. The dimple receptacle 46 is an opening where the dimple 24 will later be deposited. The dimple receptacle 46 is created using standard lithography and a dry etch of the beam structural layer 26, followed by a partial etch of the support layer 42. The opening in the structural layer 26 allows the dimple to protrude through the structural layer 26.

Next, a metal 2 layer is deposited onto the beam structural layer 26. The metal 2 layer forms the suspended armature bias electrode 30 (not shown in FIG. 5E), the conducting line 28, and the dimple 24. In the preferred embodiment, the metal 2 layer is comprised of a sputter deposition of a thin film (200 angstroms) of Ti followed by a 1000 angstrom deposition of Au. The metal 2 layer must be conformal across the wafer and acts as a plating plane for the Au. The plating is done by using metal 2 lithography to open up the areas of the switch that are to be plated. The Au is electroplated by electrically contacting the membrane metal on the edge of the wafer and placing the metal 2 patterned wafer in the plating solution. The plating occurs only where the membrane metal is exposed to the plating solution to complete the electrical circuit and not where the electrically insulating resist is left on the wafer. After 2 microns of Au is plated, the resist is stripped off of the wafer and the whole surface is ion milled to remove the membrane metal. Some Au will also be removed from the top of the plated Au during the ion milling, but that loss is minimal because the membrane is only 1200 angstroms thick.

The result of this process is that the conducting transmission line 28 and the dimple 24 are created in the metal 2 layer, primarily Au in the preferred embodiment. In addition, the Au fills the via 44 and connects the conducting line 28 to the output line 18. Au is a preferred choice for metal 2 because of its low resistivity. When choosing the metal for the metal 2 layer and the material for the beam structural layer 26, it is important to select the materials such that the stress of the beam structural layer 26 matches the stress of the conducting line 28 and the DC bias pad 30 so that the armature 16 will not bow upwards or downwards when actuating. This is done by carefully determining the deposition parameters for the structural layer. Silicon nitride was chosen for this structural layer not only for its insulating characteristics but in large part because of the controllability of these deposition parameters and the resultant stress levels of the film, an important differentiation between this work and prior art.

The beam structural layer 26 is then lithographically defined and etched to complete the switch fabrication. Finally, the sacrificial layer 42 is removed to release the armature 16.

If the sacrificial layer is comprised of SiO2, then it will typically be wet etched away in the final fabrication sequence by using a hydrofluoric acid (HF) solution. The etch and rinses are performed with post-processing in a critical point dryer to ensure that the armature 16 does not come into contact with the substrate 14 when the sacrificial layer 42 is removed. If contact occurs during this process, device sticking and switch failure are likely. Contact is prevented by transferring the switch from a liquid phase (e.g. HF) environment to a gaseous phase (e.g. air) environment not directly, but by introducing a supercritical phase in between the liquid and gaseous phases. The sample is etched in HF and rinsed with DI water by dilution, so that the switch is not removed from a liquid during the process. DI water is similarly replaced with methanol. The sample is transferred to the critical point dryer and the chamber is sealed. High pressure liquid CO2 replaces the methanol in the chamber, so that there is only CO2 surrounding the sample. The chamber is heated so that the CO2 changes into the supercritical phase. Pressure is then released so that the CO2 changes into the gaseous phase. Now that the sample is surrounded only by gas, it may be removed from the chamber into room air. A side elevational view of the MEM switch after the support layer 42 has been removed is shown in FIG. 5F.

Figure 6:
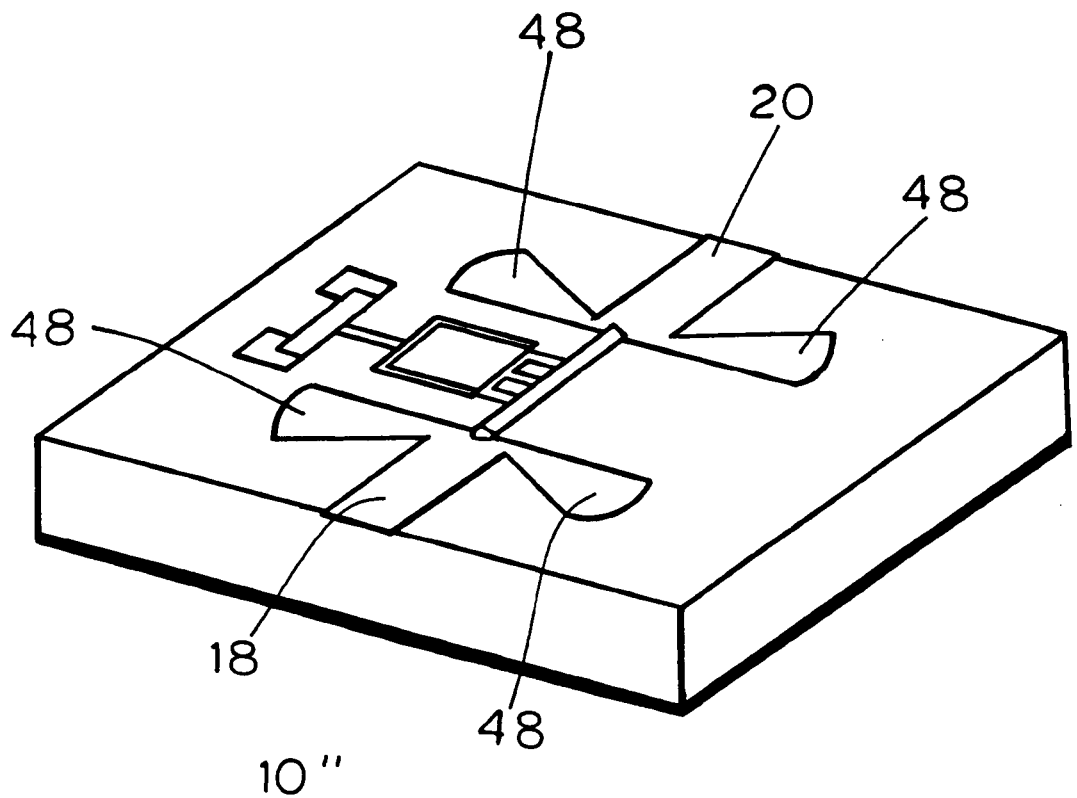
FIG. 6 is a MEM switch embodying the present invention, wherein the switch is configured with a shunt capacitance to match the MEM switch to a 50 ohm feed line.

FIG. 6 depicts a third MEM switch 10" where the MEM switch 10" is configured to be connected to a 50 ohm through line. The input line 20 and the output line 18 are segments of the 50 ohm through line. An impedance matching network, not needed when designed with short input and output lines, may be used to operate the switch 10" at frequencies greater than 5 GHz without generating reflections at the input line 20 or the output line 18. By itself, the switch 10" presents an inductive reactance when placed in series with the 50 ohm through line. In order to match the impedance of the switch 10" to the 50 ohm line, a shunt capacitance is added to the device. The shunt capacitance, in one embodiment of the design, can be realized by adding a microstrip radial stub 48 to both the input line 20 and the output line 18. The stubs 48 are angled away from the MEM switch to avoid series capacitive coupling between the stubs 48. Such series coupling would degrade the isolation of the MEM switch 10" in the open position. The resulting circuit acts as a lowpass filter for frequencies up to the low millimeter-wave range (approximately 40 GHZ). The capacitance values are chosen to maximize the cutoff frequency while maintaining a specified passband ripple.

As can be surmised by one skilled in the art, there are many more configurations of the present invention that may be used other than the ones presented herein. For example, other metals can be used to form the conducting transmission line layer, the bias electrodes and pads, and the input and output lines. The beam structural layer and the sacrificial layer may be fabricated with materials other than silicon nitride and silicon dioxide. Other impedance matching networks or circuitry can also be substituted for the radial stub embodiment shown. It is therefore intended that the foregoing detailed description be regarded as illustrative rather than limiting and that it be understood that it is the following claims, including all equivalents, that are intended to define the scope of this invention.

What is claimed is:

1. A micro-electro-mechanical switch, comprising
   a) a substrate;
   b) an input line on top of the substrate;
   c) an output line on top of the substrate and separated from the input line;
   d) a substrate electrode on top of the substrate, located nearby to but separated from the input line and the output line; and
   e) an armature comprising:
      1) a first structural layer having a first end mechanically connected to the substrate and a second end positioned over the input line;
      2) a conducting layer disposed in contact with said first structural layer;
      3) a second structural layer disposed in contact with said conducting layer; and
      4) a suspended armature electrode directly above the substrate electrode.

2. The micro-electro-mechanical switch of claim 1 wherein a first end of the conducting layer is suspended above the input line when the micro-electro-mechanical switch is in an open position, and mechanically and electrically contacts the input line when the micro-electro-mechanical switch is in a closed position.

3. The micro-electro-mechanical switch of claim 2 wherein a second end of the conducting layer is suspended above the output line when the micro-electro-mechanical switch is in an open position, and mechanically and electrically contacts the output line when the micro-electro-mechanical switch is in a closed position.

4. The micro-electro-mechanical switch of claim 2 wherein a second end of the conducting layer is at the first end of the first structural layer and electrically contacts the output line.

5. The micro-electro-mechanical switch of claim 1 wherein the conducting layer electrically connects the input line to the output line only when the micro-electro-mechanical switch is in a closed position.

6. The micro-electro-mechanical switch of claim 1 wherein the conducting layer further comprises a contact dimple that projects below a bottom surface of the armature.

7. The micro-electro-mechanical switch of claim 6 wherein a gap between the contact dimple and the input line is less than a gap between the suspended armature electrode and the substrate, and wherein the contact dimple mechanically and electrically contacts the input line when the micro-electro-mechanical switch is in the closed position.

8. The micro-electro-mechanical switch of claim 7 wherein a gap between the contact dimple and the output line is less than a gap between the suspended armature electrode and the substrate, and wherein the contact dimple mechanically and electrically contacts the output line when the micro-electro-mechanical switch is in the closed position.

9. The micro-electro-mechanical switch of claim 6 wherein the suspended armature electrode, the conducting layer, and the contact dimple each comprise layers of gold and titanium.

10. The micro-electro-mechanical switch of claim 1 wherein the input line, the output line, the substrate electrode, and the suspended armature electrode each comprise layers of gold, platinum and titanium.

11. The micro-electro-mechanical switch of claim 1, wherein the first structural layer is located above the suspended armature electrode and the conducting layer wherein the conducting layer includes a contact dimple that protrudes below a bottom surface of the conducting layer and the armature electrode.

12. The micro-electro-mechanical switch of claim 11 further comprising a dielectric layer covering the substrate electrode and electrically insulating the substrate electrode from the suspended armature electrode.

13. The micro-electro-mechanical switch of claim 1, wherein the first structural layer is located below the suspended armature electrode and the conducting layer, wherein the conducting layer includes a contact dimple that protrudes through and below a bottom surface of the first structural layer.

14. The micro-electro-mechanical switch of claim 13, wherein the second structural layer is disposed above the suspended armature electrode and the conducting layer.

15. An armature for use with a micro-electro-mechanical switch having a substrate, an input line and an output line on the substrate, the armature comprising:

a first structural layer having a first end adapted to be mechanically connected to the substrate;

a conducting layer disposed in contact with the first structural layer; and a second structural layer disposed in contact with the conducting layer.

16. The armature of claim 15, wherein the first structural layer comprises silicon nitride.

17. The armature of claim 15, wherein the conducting layer comprises a bias line.

18. The armature of claim 15, wherein the conducting layer comprises a bias electrode.

19. The armature of claim 15, wherein the conducting layer comprises a contact dimple that extends through the first structural layer.

20. The armature of claim 15, wherein the conducting layer comprises a contact dimple that extends through the second structural layer.

* * * * *